United States Patent [19]
Yagi

[11] Patent Number: 5,986,285
[45] Date of Patent: Nov. 16, 1999

[54] GROUP III-V AMORPHOUS AND MICROCRYSTALLINE OPTICAL SEMICONDUCTOR INCLUDING HYDROGEN, AND METHOD OF FORMING THEREOF

[75] Inventor: Shigeru Yagi, Minami-Ashigara, Japan

[73] Assignee: Fuji Xerox, Co., Ltd., Tokyo, Japan

[21] Appl. No.: 08/962,836

[22] Filed: Nov. 3, 1997

[30] Foreign Application Priority Data

Nov. 7, 1996 [JP] Japan ..................................... 8-295449
Mar. 6, 1997 [JP] Japan ..................................... 9-051931

[51] Int. Cl.$^6$ .................................................. H01L 29/04
[52] U.S. Cl. ............................ 257/53; 257/103; 257/615
[58] Field of Search .................................. 257/94, 96, 53, 257/101, 102, 103, 615

[56] References Cited

U.S. PATENT DOCUMENTS 5,693,963 12/1997 Fujimoto et al. ........................... 257/94

FOREIGN PATENT DOCUMENTS 2-192770 7/1990 Japan .
6-295991 10/1994 Japan .

OTHER PUBLICATIONS

Plasma Deposition of GaP and GaN:, *Journal Applied Physics* vol. 49 (3), J.C. Knights and R.A. Lujan, Mar. 1978, pp. 1291–1293 (1978 American Institute of Physics).

Plasma Deposition of GaAs:, *Thin Solid Films*, vol. 92, Y. Segui, F. Carrere and A. Bui, 1982, pp. 303–307 (Elsevier Sequoia).

*Primary Examiner*—Minh Loan Tran
*Attorney, Agent, or Firm*—Oliff & Berridge, PLC

[57] ABSTRACT

The present invention provides an amorphous optical semiconductor characterized by having a ratio of the sum total number of atoms of group III elements to the number of nitrogen atoms, in the range of 1:0.5 to 1:2 while including a hydrogen. Preferable is the amorphous optical semiconductor comprising: hydrogen in the range of not less than 1 atomic % to not more than 50 atomic %; at least one selected from the group consisting of Al, Ga and In; oxygen and carbon each of not more than 15 atomic %; and nitrogen. In addition, the present invention provides a microcrystalline compound comprising: a microcrystallire compound containing hydrogen in the range of not less than 0.5 atomic % to not more than 40 atomic %; Ga; and nitrogen in the structure thereof. Moreover, the present invention provides an optical semiconductor element using these optical semiconductors as a photoconductive subtance.

19 Claims, 6 Drawing Sheets

F I G. 1
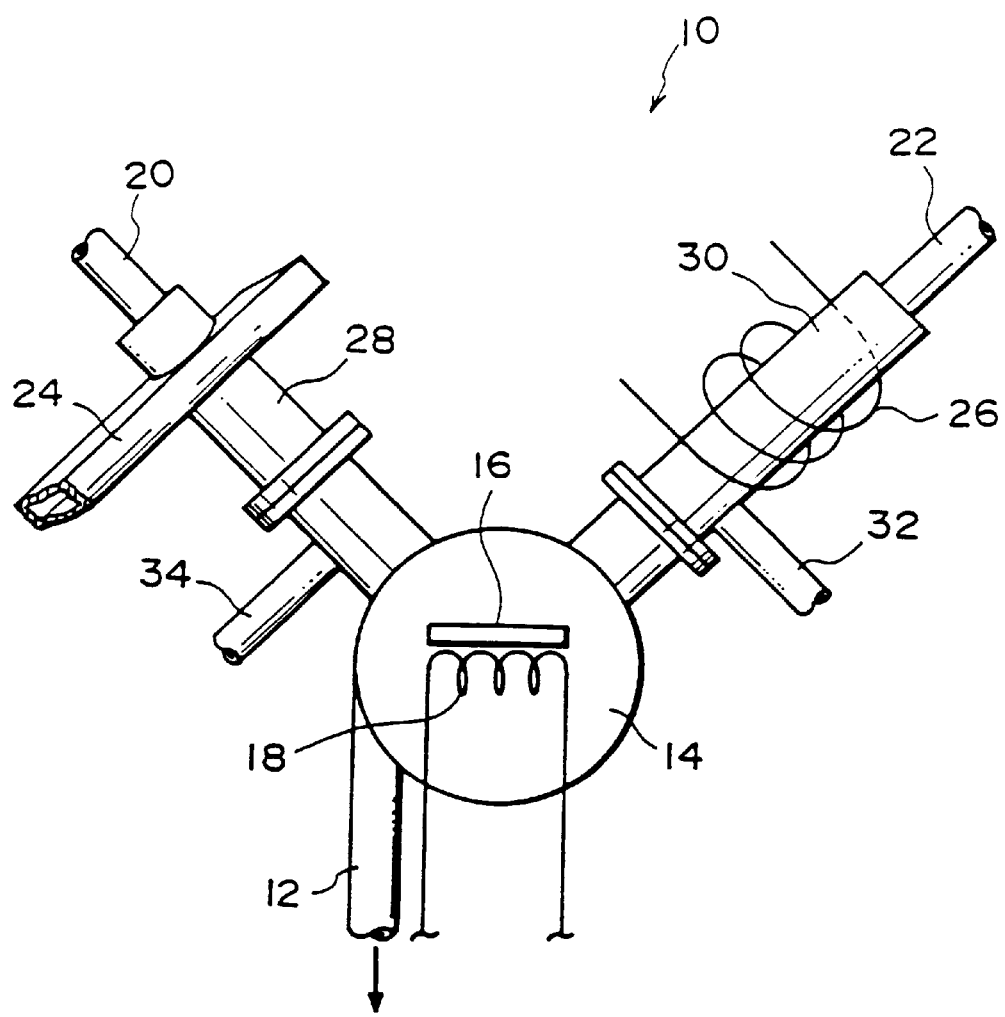

GROUP III-V AMORPHOUS AND MICROCRYSTALLINE OPTICAL SEMICONDUCTOR INCLUDING HYDROGEN, AND METHOD OF FORMING THEREOF

BACKGROUND OF THE INVENTION

1. Field of the Invention

The present invention relates to optical semiconductors comprising an amorphous optical semiconductor and a microcrystaline optical semiconductor, and processes of producing them, and an optical semiconductor element using any one of them.

2. Related Art

Heretofore, amorphous chalcogenide compounds of selenium, tellurium and the like have widely been used as a photoelectric conversion substance in image pickup tubes, photo-detectors, photosensitive materials for electrophotography and the like as an amorphous optical semiconductor (Amorphous Semiconductor Basics published by Ohm incorp.). In recent years, hydrogenated amorphous silicon has been come to be used in solar cells, image sensors, thin film transistors, photosensitive materials for electrophotography and the like.

Amorphous chalcogenide compounds, however, are subject to crystallization due to their instability to heat, thus the conditions in which they can be used with ease are limited, and they also have faults such as they cannot control valence electrons. Further, while in a hydrogenated amorphous silicon it is possible to control valence electrons, and thence to realize an electric field effect at an interface and pn junction, and also to have heat resistance up to about 250° C., however, there is the problem where photoconductivity is degraded on exposure to a high intensity light (Staebler, Wronski effect: see Applied Physics Handbook and the like) and thereby the efficiency of a solar cell is reduced during use. Moreover, while a band gap of hydrogenated amorphous silicon is about 1.7 eV, and the band gap can be adjusted to be smaller or larger by addition of Ge and C thereto, in order to effectively utilize solar light, its photoconductive characteristics are subject to deterioration even with a change of the order of 0.3 eV in the bandgap, and thereby it has had the problem that light in a broad range of wavelengths cannot effectively be utilized. Further, semiconductors made of these elements, including a microcrystal and crystal, are all of an indirect transition type, and thereby they cannot be used as materials of a light emitting device, so that their applications have been restricted.

Heretofore, amorphous materials of group III-V compound semiconductors have been used for film formation, by evaporation or sputtering of group III-V compound crystals, or by the reaction of a metal of group III in an atomic state with molecules or activated molecules including an element of group V (H. Reuter, H. Schmitt and M. Boffgen, Thin Solid Films, 254, 94 (1995)). Further, a crystalline film of group III-V compound crystals has been produced on a heated substrate, using an organometallic compound including a group III metal, and a compound including a group V element (organometallic CVD: MOCVD). When one of these methods is applied, an amorphous group III-V compound has been able to be obtained by setting the temperature of the substrate lower than between 600 to 1000° C., when producing crystals.

However, amorphous group III-V compounds have not been able to function as photoelectric materials, because of problems such as carbon from the organic metal being left in the film, many defect levels arising in the film and the like. On the other hand, it has been known that defect level density in the bands of amorphous silicon is reduced by hydrogenation and valence electrons can be controlled.

Many investigations have been conducted into the effects of hydrogen on defects in crystalline group III-V compounds with the following findings: (1) crystalline dislocations are improved, Y. Okada, S. Ohta, H. Shimomura, A. Kawabata and M. Kawabe, J. J. Appl. Phys., 32, L1556 (1993); (2) defects at the interface with the surface oxide film are improved, Y. Chang, W. Widdra, S. I. Yi, J. Merz, W. E. Weinberg and E Hu, J. Vac. Sci. Tech. B12. 2605 (1994); (3) the n+-p junction interface is improved, S. Min, W. C. Choi, H. Y. Cho, M. Yamaguchi, Appl. Phys. Lett 64, 1280 (1994); (4) defects from lattice mismatching are improved, B. Chatterjee, S. A. Ringel, R. Sieg, R. Hoffman and I. Weinberg, Appl. Phys. Lett 65, 58 (1994); and (5) bond defects are passivated. From the aforementioned effects of hydrogen, it can be expected that because of the problems in changing from a crystalline state to an amorphous state, the same relationship between crystalline silicon and amorphous silicon will occur in group III-V compound semiconductors.

On the other hand, it has been known that, in a III-V compound semiconductor, dopants for use in pn control are passivated at the same time as being inactivated (S. J. Pearton, Material Sci. Forum, 148 to 149, (1994) 113 to 139). It has also been known that dopants made inactive due to passivation, are reactivated by annealing. In the same way, hydrogen passivates dangling bond defects, but in the case of an amorphous film, the composition of the elements of which the films constructed, and the content of hydrogen in the film as well as its bonding positions are important, in order to inactivate the pn control dopants together with the dangling bonds.

In the conventional method of producing amorphous group III-V compound semiconductors, crystals are used as the raw material and produced by sputtering in a system containing no hydrogen, (H. Reuter, H. Schmitt, M. B. Offgen, Thin Solid Films 254, 94 (1995).

Further, regarding amorphous group III-V compound semiconductor containing hydrogen, hydrogenated a-GaP photoconductivity, obtained by reactive evaporation with $H_2$ has been reported (M. Onuki, T. Fujii and H. Kubota, J. Non-Cryst, Solids, 114, 792 (1989)), and hydrogenated a-GaAs photoconductivity has also been reported (V. Coscia, R. Murri, N. Pinto, L. Trojani, J. Non. Cryst. Soild, 194 (1996) 103). In these semiconductors, however, the contrast resistance ratio is small, only to the order of two digits, moreover, pn control, which is indispensable for semiconductor material in terms of practical use, cannot be effected.

Further, amorphous GaP containing hydrogen or microcrystalline GaN have been obtained by the plasma CVD method, which is a low temperature film formation method which uses an organometallic compound as the group III raw material but they either show no photoconductivity or else insulation properties (J, Knight, and R. A. Lujan, J. Appl. Phys., 42. 1291 (1978)). A further problem has been that hydrogenated amorphous GaAs produced by the plasma CVD method, only has a very small photoconductivity, of the order of 10%, and is a long way from reaching the point of practical use, and since an organometallic compound is used as the raw material of group III, removal of carbon from the film is difficult in the low temperature regions required for obtaining an amorphous state (Y. Segui, F. Carrere and A. Bui, Thin Solid Films, 92, 303, (1982)).

While, in Japanese Patent Application Laid-Open (JP-A) No. 6-295991, amorphous group III–V compound semiconductors produced by either the sputtering method, the CVD method, the molecular beam epitaxy method, or the plasma CVD method have been proposed as an anti-fuse memory material which has a lower melting point than Si, it has been said that GaN and AlN are not suitable. And in the publication, there is no description of their characteristics as optical semiconductors.

A technique has been disclosed, as described in Japanese Patent Application Laid-Open (JP-A) 2-192770, that a combination of InN which has absorption in the visible light region and a small bandgap and amorphous silicon, is used as the microcrystalline material of a group III–V compound semiconductor. However, InN has a bandgap of 1.9 eV, and therefore it is necessary that the bandgap be variable over a broad range so that light may be absorbed and emitted efficiently over the total visible range. On the other hand, crystal GaN has a bandgap of the order of 3.1 eV and so has absorption in the ultraviolet region. At present, while buffer layers are widely used for the production of GaN crystals, the structure of the film is not very clear, although the temperature for growth has been to the order of 600° C. lower than that for crystal growth. In cases where film formation is effected at a temperature lower than that of crystal growth, a microcrystalline film is thought to be grown. However, when crystal growth is continued, growth is effected in the range of 800 to 1000° C. This step has only been used for alleviating lattice mismatching with the substrate, and microcrystaline compounds have not been used as a single film.

SUMMARY OF THE INVENTION

A first object of the present invention is to provide an amorphous optical semiconductor, that can be a new optoelectronics material produced at a low cost, in which the above mentioned defects of an amorphous group III–V compound semiconductor can be remedied, in which the effects of hydrogen on amorphous and crystalline semiconductors are utilized, in which an optical gap with a broad range is freely selected, with a high resolution, excellent photoconductivity, a high speed response, and high resistance to an environmental conditions and to high temperatures, and with a large area which is optically active.

A second object of the present invention is to provide a method of producing an amorphous optical semiconductor with the above mentioned characteristics safely and at a low cost.

A third object of the present invention is to provide an optical semiconductor element having the above mentioned amorphous optical semiconductor.

A fourth object of the present invention is to provide a microcrystaline compound optical semiconductor, that can be a new optoelectronics material produced at a low cost, in which the above mentioned faults of a microcrystalline group III–V compound semiconductor can be repaired, in which an optical gap with a broad range is freely selected, with excellent photoconductivity, a high speed response, and high resistance to an environmental conditions and high temperatures, and with a large area which is optically active.

A fifth object of the present invention is to provide a method of producing a microcrystalline compound optical semiconductor having the above mentioned characteristics safely and at a low cost.

A sixth object of the present invention is to provide an optical semiconductor element using a microcrystalline compound optical semiconductor with the above mentioned characteristics.

That is to say, the first object of the present invention has been achieved by the use of an improved material and a method of producing the improved material, in which the improved material is an amorphous group III–V compound semiconductor, which contains hydrogen, and which is a III–V nitride, and in which defects of the conventional amorphous III–V compound are deleted by removing carbon at low temperature and by compensating defects in the film with hydrogen, and in which a dopant is included in an activated state.

That is to say, the amorphous optical semiconductor of the present invention is produced in such a manner that a compound including at least nitrogen is first activated to an energy state and to an excited species, an organometallic compound containing a group III element is decomposed and/or activated by a reaction with the activated species, and these activated species containing activated hydrogen are further reacted, so that a group III–V compound film is produced. The present invention has been completed on the basis of discoveries that, in such steps, an organic group is separated as a stable molecule from the organometallic compound even at the low temperatures at which an amorphous film can grow, the organic group is incorporated into the film, defects due to unjoined bonds can be eliminated, and the amount of impurities can be reduced to the barest traces, by an action with which carbon on the surface of a film is removed during film growth, by either activated hydrogen produced from the organic group, or activated hydrogen from hydrogen and hydride externally added to the system. Besides, it is contrived so that a stoichiometric state can be easily achieved by choosing nitrogen, which is present as a gas, as an element of group V, even in the amorphous state which allows the rate of composition to be freely determined.

The amorphous optical semiconductor of the present invention has the characteristic that the ratio of the sum total number of atoms of the group III element, including hydrogen to the number of nitrogen atoms is in the range of 1:0.5 to 1:2.

The method of producing an amorphous optical semiconductor of the present invention is a method comprising the steps of: activating a compound containing nitrogen to a required energy state and to an excited species; and reacting the activated species with an organometallic compound including at least one selected from the group consisting of Al, Ga and In.

The amorphous optical semiconductor of the present invention preferably has hydrogen in the range of 1 atomic % to 50 atomic %, at least one selected from the group consisting of Al, Ga and In, oxygen and carbon each of 15 atomic % or less, and nitrogen.

In this method producing an amorphous optical semiconductor, as the activating means for activating a compound including nitrogen to a required energy state and to an excited species, the energy of an electric discharge, for example, the energy of a high frequency discharge and/or a microwave discharge can be utilized. Raw material in a gaseous state including at least one selected from the group consisting of Al, Ga and In, or an element for pn control is introduced into the downstream side of each of the respective activating means.

The optical semiconductor element has either a member, having been used as a photoconductive member, made of the above mentioned amorphous optical semiconductor, or at least one of a p-type amorphous optical semiconductor and an n-type amorphous optical semiconductor.

The fourth object of the present invention has been achieved by use of an improved material and a method of producing the improved material, in which the improved material is a microcrystalline group III–V compound semiconductor having specific amounts of hydrogen, Ga and nitrogen, and in which the defects of the conventional microcrystalline group III–V compound photoconductive material are deleted by removing carbon at low temperature, by compensating defects in the film with hydrogen, and, as a result, in which a dopant comes to be included in an activated state.

That is to say, the microcrystalline compound optical semiconductor of the present invention has, in its structure, the characteristics of a microcrystalline compound containing hydrogen in the range of 0.5 atomic % to 40 atomic %, and Ga and nitrogen.

The microcrystalline compound optical semiconductor of the present invention (hereinafter also referred to as microcrystalline optical semiconductor) is formed using an organometallic compound containing at least Ga.

The microcrystaline compound optical semiconductor of the present invention further contains Al and/or In.

The method of producing the microcrystalline optical semiconductors of the present invention is implemented in such a manner that a compound including at least nitrogen is first activated to an energized state and to an excited species, an organometallic compound containing Ga is decomposed and/or activated by a reaction with this activated species, or else a hydrogen and a hydride, both of which are externally added to the system, are activated to a required energy state and to an excited species, an organometallic compound containing Ga is decomposed and/or activated by a reaction with this activated species and made to react with the activated species containing nitrogen, so that a group III–V compound film is produced. The present invention has been completed on the basis of discoveries that, in such steps, an organic group is separated as a stable molecule from the organometallic compound even at the low temperatures at which a microcrystalline film can grow, this organic group is not incorporated into the film, defects due to unjoined bonds can be eliminated, and the amount of impurities can be reduced to their barest traces, by an action with which carbon on the surface of a film is removed during film growth by either activated hydrogen produced from the organic group, or activated hydrogen from hydrogen and hydride externally added to the system. Besides, it is contrived so that a stoichiometric state of the ratio of composition can be easily achieved by choosing nitrogen as an element of group V.

That is to say, the microcrystalline compound optical semiconductor is produced in such a manner that a compound containing nitrogen is activated to the activated species and excited species which are required to cause a reaction with an organometallic compound containing Ga, these activated species are made to react with an organometallic compound containing Ga and, if desired, Al and In. As the activating means for activating a compound including nitrogen and a compound containing hydrogen to a required energy state and to an excited species, an energy discharge, for example, a high frequency energy discharge and/or a microwave discharge can be utilized. Raw material in a gaseous state including Al, Ga, In and the like, or raw material in a gaseous state including an element for pn control is introduced into the downstream side of each activating means.

The optical semiconductor element of the present invention is characterized by the use of the above mentioned microcrystalline compound optical semiconductor as a photoconductive member, and may be equipped with at least one of a p-type microcrystalline compound optical semiconductor and an n-type microcrystal compound optical semiconductor.

The optical semiconductor of the present invention contains at least one of the elements selected from the group consisting of C, Si, Ge and Sn as an element for n-type control or contains at least one of the elements selected from the group consisting of Be, Mg, Ca, Zn and Sr as an element for p-type control.

BRIEF DESCRIPTION OF THE DRAWINGS

FIG. 1 is a view showing the schematic structure of a preferred embodiment of an apparatus for producing the optical semiconductor of the present invention.

DETAILED DESCRIPTION OF THE PREFERRED EMBODIMENTS

Figure 2:
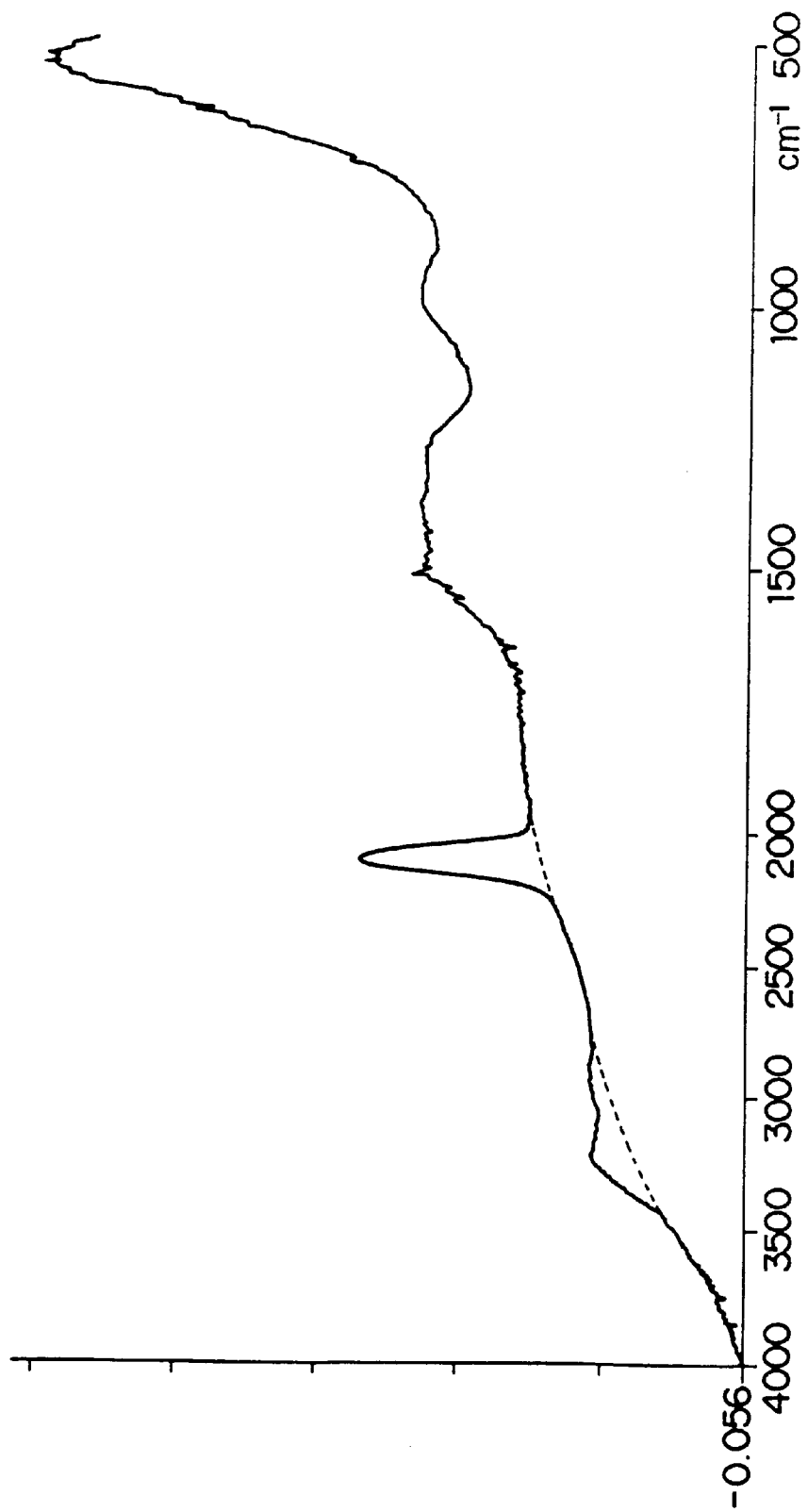
FIG. 2 is a graph showing the infrared absorption spectrum of the film composition obtained in Example 2.

The amorphous optical semiconductor of the present invention has a ratio of the total number of atoms of the group III element to the number of atoms of nitrogen in the range of 1:0.5 to 1:2, while including hydrogen. In general, an amorphous state indicates a solid state in which a crystalline lattice is almost not recognized, but there are many cases where a clear boundary between amorphous and crystalline states is not found. The amorphous state of the present invention includes cases where the amorphous state only has an orderly arrangement secured in a short range between neighboring atoms, and microcrystals are included in the bulk of this amorphous state, or cases where the whole body is a collection of microcrystals. However, in these cases, a microcrystal is less than 100 Å, or preferably less than 50 Å in size and a structural order is not to be recognized through at the whole of the amorphous optical semiconductor.

The amorphous optical semiconductor of the present invention has a ratio of the sum total number of atoms of the group III element to the number of atoms of nitrogen in the range of 1:0.5 to 1:2. When the ratio of atomic numbers is less than 1:0.5 or it is in excess of 1:2, a crystal structure of a Zincblend type, formed from the combination of a group III element with a nitrogen element, is rarely formed in the bulk and thereby defects are increased and the amorphous optical semiconductor does not function satisfactorily.

The amorphous optical semiconductor of the present invention contains hydrogen preferably an amount ranging from 1 atomic % to 50 atomic %. If the amount of hydrogen is less than 1 atomic % in the film of the amorphous optical semiconductor, then the amount is not enough to eliminate unjoined bonds, which occur by changing the bulk into an amorphous state while keeping Al, Ga and In as a group III element and nitrogen as a group V element at sites in a three-dimensional structure, by bonding with the hydrogen. Nor is it enough to inactivate defect levels formed in the band, so that the amorphous optical semiconductor cannot function as a practical material.

On the other hand, when the content of hydrogen in the film is more than 50 atomic %, the probability of two or more hydrogen atoms bonding with one atom of each of Al, Ga and In as a group III element and with one nitrogen atom as a group V element is increased, with the result that these elements do not hold the three-dimensional structure and come to produce a network in the shape of a chain, new levels are created in the band, electric characteristics are deteriorated, and mechanical properties, such as hardness, are degraded. Besides, the film becomes prone to oxidation, and as a result many impurity defects are produced in the film and good photoelectric characteristics cannot be obtained. Further, when the content of hydrogen in the film is increased to more than 50 atomic %, a dopant which is used for doping in order to control electric characteristics is activated by hydrogen, so that no amorphous semiconductor which is electrically active can be obtained.

Oxygen and carbon amounts in the amorphous optical semiconductor preferably are 15 atomic % respectively. When oxygen in the film is more than 15 atomic %, the oxygen forms stable bonds with Al, Ga and In as the group III elements, thereby the three-dimensional structure constructed by Al, Ga and In, and nitrogen as the group V element is partially changed to a two-dimensional soft structure and therefore a substitutive type dopant for electric control is prevented from assuming a bond configuration, which is electrically active, in the three-dimensional rigid structure, with the result that pn control cannot be effected.

Moreover, when more than is atomic % of carbon is included in the film, since the bonds between carbon and hydrogen (81 kcal/mol) are stabler than the bonds between an atom of each of Al, Ga and In as the group III atoms and the hydrogen atoms (Al—H: 68.1 kcal/mol, Ga—H: 66 kcal/mol, In—H: 59 kcal/mol), the hydrogen tends to bond more with carbon atoms. In addition, carbon easily forms bonding forms of —$CH_2$— and —$CH_3$ to produce a chain structure and a void, thereby defect levels are increased throughout the bulk of the film, and when a dopant is doped, pn control cannot be effected due to its structural softness. In a transparent film with the conventional wide band gap, since the film changes color from yellow to brown, optical characteristics are deteriorated. While concentrations of oxygen and carbon in the vicinity of the surface of the film are sometimes increased by surface adsorption and contamination or by oxidation of the surface, however, concentrations of oxygen and carbon in the present invention indicate the concentrations in a part these types of effects do not occur.

In order to attain an amorphous structure while maintaining a three-dimensional structure, unjoined bonds are produced on both sides of a group III element and a group V element. For this reason, it is preferred that hydrogen bonds equally with a group III element and a group V element. Moreover, if hydrogen bonds with a dopant, the dopant cannot effect a substitutive impurity doping, therefore it is preferable that hydrogen does not bond with the dopant. These bonding states of hydrogen can easily be measured by an infrared spectrum.

When the amorphous semiconductor of the present invention includes microcrystals, it is characterized by having a microcrystalline compound containing hydrogen in the range of 0.5 atomic % to 40 atomic %, Ga, and nitrogen elements included in its structure, and may include one or more of Al and In. Al can be included in the range of 0.1 atomic % to 99.9 atomic % of the total number of atoms of the group III elements and In can be included in the range of 0.1 atomic % to 99.9 atomic % of the total number of atoms of the group III elements.

The amorphous semiconductor may be made of layers all composed of microcrystalline compounds or may be in a mixed state in which the microcrystalline compounds are dispersed. When in the mixed state, the proportion of microcrystalline compounds dispersed in an amorphous layer preferably is 20 volume % or more, and more preferably 30 volume % or more. The proportion can be measured by the electron microscopic photograph method. It is also calculated from the line width and peak intensity of the peak streching vibration of group V atoms—N atoms in the Infrared absorption spectrum.

The crystalline system of the aforementioned microcrystalline compound may be either a cubic system or a hexagonal system, or a mixture of a plurality of systems.

The size of the microcrystals preferably range from 5 nm to 100 $\mu$m, and the size can be measured by any well known method such as X-ray diffraction, electron beam diffraction or measurement of a cross-section of the shape by electron microscopic photography.

Microcrystals less than 5 nm insize are undesireable as their condition cannot be confirmed by any of the above mentioned methods and there is a risk that the desired result may not be obtained after production of a semiconductor. While even when the size of a microcrystal is more than 100 $\mu$m, its function as a semiconductor is not reduced. However, the above mentioned range is preferable, from the view point of obtaining a semiconductor with a higher resistance than that of a crystal and a lower resistance than that of an amorphous film, which is an object of the present invention, and from the view point of controlling the configuration of the film, as well.

When microcrystals are included, hydrogen included in the optical semiconductor preferably is in the range of 0.5 atomic % to 40 atomic %, or more preferably in the range of 1 atomic % to 30 atomic %. When the amount of hydrogen is less than 0.5 atomic %, it is not enough for bond defects at crystal grain boundaries and defects in the interior of the amorphous layers to be eliminated by bonding with hydrogen and for defect levels produced in the band to be inactivated, so that the amount of defects is increased, dark resistance is decreased and the optical sensitivity is deteriorated and therefore the microcrystalline optical semiconductor cannot function practically.

On the other hand, when the amount of hydrogen in the film is more than 40 atomic %, the probability of two or more hydrogen atoms bonding with each atom of a group III element and a group V element, is increased, the group III element and group V element do not hold a three-dimensional structure but form a two-dimensional network in the shape of a chain, many voids are created especially at grain boundaries and, as a result new levels are formed in the band. For this reason, electric characteristics deteriorate and mechanical properties such as hardness are reduced as well. Moreover, the film is prone to oxidation and many impurity defects occur in the film, so that good photoelectric characteristics cannot be obtained.

When the amount of hydrogen in the film is more than 40 atomic %, the hydrogen inactivates the dopant which is doped for controlling electric characteristics, and as a result a microcrystalline compound semiconductor, which is electrically active, cannot be obtained.

The ratio between the numbers of atoms of a group III element and nitrogen preferably is in the range of 1:0.7 to 1:1.5. When the ratio between numbers of atoms of a group III element and nitrogen is less than 1:0.7 or more than 1:1.5, the proportion of bonds between the group III element and the group V element, which assumes a Zincblend type crystal system, is small, many defects are created and the microcrystal semiconductors does not function as a good semiconductor.

The microcrystalline optical semiconductor of the present invention can be obtained by activating a compound containing a nitrogen element and reacting the compound with Ga or an organometallic compound containing Ga. The Ga used here may be metallic Ga, but, instead, it is preferable that an organometallic compound containing Ga, and if desired further containing Al and In elements as well, is used in the reaction from the view point of controlling the film structure. Organometallic compounds containing Ga used here are trimethyl gallium, triethyl gallium, tert-butyl gallium and the like.

If a three-dimensional structure is attained with microcrystals in the film as a whole, unjoined bonds are produced at the grain boundary on both sides of the group III element and nitrogen. Because of this, it is preferable that the hydrogen which deactivates the unjoined bonds is able to be bonded equally with both the group III element and the nitrogen element. If hydrogen bonds with a dopant, doping of a substitutive type impurity cannot be effected and therefore it is preferable for the hydrogen not to bond with a dopant. These bonding states of the hydrogen are easily measured by an infrared absorption spectrum.

Compositional ratios in a film can be measured by X-ray photoelectronic spectroscopy (XPS), electron microprobe, hydrogen ford backscattering (HFS) or the like. The amount of hydrogen is measured by Rutherford backscattering (RBS) as an absolute value. The amount of hydrogen can be found by measuring the hydrogen release while heating, or by measuring the IR spectra.

The optical semiconductor of the present invention can be produced in the following way.

The description will be made according to the accompanying drawings. FIG. 1 is a schematic view showing an apparatus for producing a semiconductor, which has means for activating plasma suitable for the production of the optical semiconductor of the present invention.

The apparatus 10 for producing a semiconductor comprises: a vessel 14 equipped with an exhaust port 12, which can be evacuated to vacuum, and a substrate holder 16 and a heater 18 for heating a substrate mounted in the vessel 14. Quartz pipes 28, 30, to which two gas inlet pipes 20, 22 are respectively connected, communicate with the vessel 14, the gas inlet pipe 20 is connected to the quartz pipe 28, and the gas inlet pipe 22 is connected to the quartz pipe 30.

In the vessel 14, as a nitrogen source, $N_2$ gas, for example, is used and the gas is introduced through the gas inlet pipe 20 into the quartz pipe 28. Microwaves of 2.45 GHz are supplied to a microwave guide pipe 24 connected with a microwave oscillator using a magnetron (not shown), and discharge is generated in the quartz pipe 28. $N_2$ gas in the quartz pipe 28 is activated by this discharge. This activation is effected so that a energy state and an excited species which are required for starting a reaction with an organometallic compound containing Ga is obtained, in other words, so that an energy state in which a Ga—C bond and Ga—H bond can be disconnected or a state in which the organometallic compound is transformed to a radical is obtained.

A gas, for example, $H_2$ gas is introduced through another gas inlet pipe 22 into the quartz pipe 30. A 13.56 MHz high frequency wave is supplied to a high frequency wave coil 26 from a high frequency wave oscillator (not shown) to generate a discharge in the quartz pipe 30. Trimethyl gallium is introduced through the third gas inlet pipe 32 to the downstream side of the discharge space. Materials activated in the respective quartz pipes 28, 30 are introduced into the vessel 14, and gallium nitride in the state of microcrystal or in an amorphous state is formed on a substrate.

When an amorphous optical semiconductor is obtained, the temperature of the substrate is in the range of 20° C. to 600° C. In the above mentioned apparatus, the activated nitrogen or the activated hydrogen which is formed by the energy discharge may be controlled independently, or a gas including nitrogen and hydrogen at the same time, such as $NH_3$ may be used instead. Further, $H_2$ may be added to the gas. Moreover, conditions in which activated hydrogen is freely produced from an organometallic compound can be employed. In this way, activated group III element atoms and nitrogen atoms exist on the substrate in a controlled state and, since hydrogen atoms transform methyl group and ethyl groups into inactive molecules such as methane, ethane and the like, almost no carbon is mixed into the film regardless of the low temperature, so that an amorphous film or a microcrystalline film in which defects are suppressed can be produced.

In some cases, part of the compound produced becomes amorphous according to the temperature of the substrate, and the gas flow rate and pressure. When the temperature of the substrate is high and/or the flow rate of the group III raw material gas is low, since the compound produced is microcrystalline, these conditions need to be controlled in order to produce the desired microcrystalline compound. However, this control can only be properly executed by a person skilled in the art. In general, microcrystals can be obtained with the substrate at a temperature in the range of 100° C. to 600° C. When the temperature of the substrate is lower than 300° C. and the flow rate of the group III raw material gas is low, then the film becomes microcrystalline. When the temperature of the substrate is higher than 300° C., the film tends to become microcrystalline, even if the flow rate of the group III raw material is higher than that of the lower temperature conditions. These are the controls required for obtaining sufficient conditions for growing microcrystals. However, care needs to be taken when the temperature of the substrate is low and the flow rate of the group III raw material gas is high, because the proportion of amorphous material is increased.

Organometallic compounds containing indium and aluminum can be mixed instead of trimethyl gallium. These organometallic compounds may be introduced through the gas pipe 34.

An optional conductive-type amorphous or microcrystalline nitride semiconductor, such as an n-type or a p-type, can be obtained by introducing a gas containing at least one selected from the group consisting of C, Si, Ge and Sn, or a gas containing at least one selected from the group consisting of Be, Mg, Ca, Zn and Sr to the downstream side of the discharge space (the gas inlet pipe 34 or the gas inlet pipe 32). In the case of C, carbon in an organometallic compound may be used depending on the conditions.

As a means of activating nitrogen compounds in the above mentioned apparatus, a high frequency oscillator, a microwave oscillator, an electrocyclotron resonance system or a helicon plasma system may be used either singly or in combinations of two or more. Moreover, two microwave oscillators or two high frequency wave oscillators may be used. When a high frequency discharge is used, either an inductive type or a capacitive type may be used. Further, two electrocyclotron resonace systems may be used. When a different activating means (excitation means) is used, discharges are required to be generated at the same time at the same pressure and for this reason there may be a difference in pressure between the discharge space and the film forming section (in the vessel 14). When discharges are effected at the same pressure and if different activating means (excitation means) are used, for example, a microwave oscillator and a high frequency wave oscillator are used, the excitation energy for an excited species can be changed by a large margin, which is effective for control of the film quality.

Film formation of the amorphous optical semiconductor or the microcrystalline compound semiconductor of the present invention can be conducted in an atmosphere, in which hydrogen at least is activated, such as by the reactive evaporation method, ion plating, reactive sputtering or the like.

The substrate used in the present invention may be of conductive material or insulating material, and maybe of either crystal or amorphous material. As a conductive substrate, metals or alloy crystals thereof such as aluminum, stainless steel, nickel, chromium and the like can be used, and semiconductors such as Si, GaAs, SiC, ZnO and the like can be used.

An insulating substrate, whose surface has received a treatment to give a conductivity, can be used. As an insulating substrate, high polymer film, glass, quartz, ceramics and the like can be used. The treatment to give conductivity requires forming a film by the evaporation method, the sputtering method, the ion plating method or the like using one of the above mentioned metals, gold, silver, copper or the like.

As the translucent base of the transparent conductive substrate used for input or output of light, a transparent inorganic material such as glass, quartz, sapphire or the like, or a transparent organic resin film or plate such as fluororesin, polyester, polycarbonate, polyethylene, polystyleneterephthalate, epoxy or the like or optical fiber, selfoc optical plate or the like is used.

The transparent electrode used on the aforementioned translucent base is formed by a method such as evaporation, ion plating, sputtering, or the like, using transparent materials such as ITO, zinc oxide, tin oxide, lead oxide, indium oxide, copper oxide, and the like. Equally, it can be formed by a method such as evaporation, or sputtering using metals such as Al, Ni, and Au, which have been rendered to a semi-transparent thickness.

As raw material for the amorphous optical semiconductor of the present invention, an organometallic compound including at least one element selected from the group III elements of Al, Ga and In can be used. As raw material for the microcrystalline compound optical semiconductor of the present invention, an organometallic compound including at least one element selected from the group consisting of Ga, and if desired Al or In.

These organometallic compounds include liquids and solids such as trimethyl aluminum, triethyl aluminum, tert-butyl aluminum, trimethyl gallium, triethyl gallium, tert-butyl gallium, trimethyl indium, triethyl indium, tert-butyl indium and the like which can be used singly in a gaseous state after being gasified, or as a mixture produced by bubbling a carrier gas through one of them. As the carrier gas, hydrogen, $N_2$, a hydrocarbon such as methane, ethane or the like, a carbon halogenide such as $CF_4$, $C_2F_6$ or the like can be used.

A gas, or a liquid which has been gassified, or which has had a carrier gas bubbled through it such as $N_2$, $NH_3$, $NF_3$, $N_2H_4$, methyl hydrazine, or the like may be used as the nitrogen raw material.

The amorphous optical semiconductor or the microcrystalline compound optical semiconductor of the present invention can have an element doped into the film for p, n control.

As the element for n-type doping, Li of Group Ia, Cu, Ag, or Au of Group Ib, Mg of Group IIa, Zn of Group IIb, Si, Ge, Sn or Pb of Group IVa, or S, Se or Te of Group Via can be used.

As the element for p-type doping, Li, Na or K of Group Ia, Cu, Ag or Au of Group Ib, Be, Mg, Ca, Sr, Ba or Ra of Group IIa, Zn, Cd or Hg of Group IIb, C, Si, Ge, Sn or Pb of Group IVa, S, Se or Te of Group VIa, Cr, Mo or W of Group VIb, or Fe, Co or Ni of Group VIIa or the like can be used.

In an amorphous state, it has been known that hydrogen in a film of crystal bonds with a dopant thereby inactivating it. In order that the doping element is able to function as dopant in an amorphous network, hydrogen, which is used to passivate defect level, is required to selectively bond with a group III element and a group V element instead of bonding with the dopant. The bonding energy preferably satisfies the following relationship that (a group III element)—H or (a group V element)—H>(a dopant element)—H.

In a microcrystalline state, in order that hydrogen in the film does not bond with a dopant thereby inactivating it, hydrogen, which is used to passivate defect levels, is required to selectively bond with a group III element and a nitrogen element without bonding with the dopant.

From this view point, Si, Ge, and Sn are particularly preferred as the element for n-type doping and as the element for p-type doping, Be, Mg, Ca, Zn and Sr are particularly preferred.

In doping, compounds for n-type doping are $SiH_4$, $Si_2H_6$, $GeH_4$, $GeF_4$, and $SnH_4$ and those for p-type doping are $BeH_2$, $BeCl_2$, $BeCl_4$, cyclopentadienyl magnesium, dimethyl calcium, dimethyl strontium, dimethyl zinc, diethyl zinc and the like are used in a gaseous state. In order to dope an element in the film, a well known method such as the thermal diffusion method, the ion implantation method, or the like can be adopted.

An optical semiconductor element may be made using the optical semiconductor of the present invention, simply by preparing an undoped film and a p-type, l-type, or n-type of microcrystalline semiconductor film on top of the substrate. Alternatively, a pn junction may be made by creating a p-type and n-type film, or instead an l-type film may be inserted between the p-type and n-type films. Moreover, a $p^+$type film or an $n^+$type film, both of which are doped to a higher concentration than the p-type or n-type film, may be inserted between the electrode and the film to help contact with the electrode. Further, a multilayer structure can be formed with either a pn or pin structure as the structural unit. Additionally, in order to maintain transparency and barrier durability, these p-type, i type and n-type layers may have differing compositions of N and respectively Al, Ga, In. Alternatively, the films may respectively have multilayer structures.

The thickness of each film may be in the range of 1 nm to several tens of $\mu$m. Films of the same thickness may be laminated and repeated and films of differing thicknesses may also be laminated and repeated. These layer structures can be given suitable settings depending on the light adsorption rate, the electric fields of the active areas, the barrier length, and so on, required for optical semiconductor elements.

An optical semiconductor element using this type of optical semiconductor has a bandgap variable in all the range from red to ultraviolet, a high light permeability, a high light sensitivity and a high speed response and thereby can make it possible to be effectively used in the broad range from visibility to ultraviolet, not only in a single layer film but also in a multilayer film if a tandem type is adopted, in which the device is constructed from layers different in absorption region in a successively layered structure.

The optical semiconductor device is excellent in resistance to light exposure, heat resistance and resistance to oxidation and is capable of a high speed response. Besides, it is capable of light emission through the whole wave range, which a conventional microcrystalline semiconductor does not have, and for this reason it can be used in a hybrid device combining an electronic device and a light emitting device. To give concrete examples, applications could be a high efficiency solar cell, a high speed TFT, a electrophotographic material, a high sensitivity photosensor, a high sensitivity avalanche photosensor, a large area LED, a full color flat display, a light modulator, a device for light interconnecting and the like.

The amorphous optical semiconductor of the present invention as described above, has a high light permeability, a low dark conductivity and a high light sensitivity, it thereby being possible to have light effectively used in a broad range, from visible light to ultraviolet light. Besides, since it is excellent in resistance to light exposure, heat resistance and resistance to oxidation and has a high speed response, it can be used in various kinds of optical semiconductor device requiring those characteristics.

EXAMPLES

Example 1

An Al substrate, a quartz substrate and an Si wafer which had been cleaned were placed on the substrate holder 16, a vacuum was created in the vessel 14 using the exhaust port 12 and thereafter the substrates were heated to 250° C. by the heater 18. $N_2$ gas was introduced through the gas inlet pipe 20 into the quartz pipe 28, being 25 mm in diameter, at a flow rate of 500 sccm, and microwaves were discharged at a frequency of 2.45 GHz at an output of 200 W by way of the microwave guide pipe 24, while matching was made with a tuner. At this time, reflected waves were at 0 W. $H_2$ gas was introduced through the gas inlet pipe 22 into the quartz pipe 30, being 30 mm in diameter, at a flow rate of 200 sccm. An output of microwaves was set at 200 W. Reflected waves were at 0 W. In the conditions, a vapor of trimethyl gallium (TMGa) kept at room temperature is introduced through the gas inlet pipe 32, while a mass flow controller directly controls a feed rate at 2 sccm. The reaction pressure was measured with a varatron vacuum guage at 0.2 Torr.

After film formation had been conducted for one hour, a thickness of film of 3 $\mu$m was measured by step measurement. The composition was measured with XPS and RBS (Rutherford backscattering) and the Ga/N ratio was 1.1, which was found to be approximately equal to the stoichiometric relation. At this time, carbon (C) was included at 8 atomic %, but no oxygen (O) was detected. The optical gap was measured to be 3.5 eV. Results of measurement by IR spectra showed hydrogen was included in the GaN film as Ga—H and N—H. The amount of hydrogen included in the film was measured at 20 atomic % being released by heating in a vacuum. No clear peaks were observed in the X-ray diffraction spectra, which indicated the film was in a amorphous state. Electric resistivity was measured on the amorphous GaN film at $2.0 \times 10^{14}$ $\Omega$cm and it was measured at $1.5 \times 10^{10}$ $\Omega$cm under exposure to Xe lamp light, which showed a photoconductivity light-dark ratio of more than 4 digits.

Example 2

A film was formed under the same conditions as in example 1, except that the discharge of $H_2$ gas was conducted with high frequency waves at 13.56 MHz, and an output of 100 W, by way of a high frequency coil 26.

The film composition had a Ga/N ratio of 0.99, almost attaining stoichiometric ratio, and carbon was measured at 3 atomic %. No oxygen was measured and hydrogen was measured at 30 atomic %. Resistivity in dark conditions was $1 \times 10^{14}$ $\Omega$cm and the ratio between resistivities, in dark and light conditions was more than four digits.

The infrared absorption spectrum of the film composition was as shown in FIG. 2. The peak at 2900 $cm^{-1}$ in FIG. 2 was the stretching vibration of C—H, the peak in the vicinity of 3200 $cm^{-1}$ was the stretching vibration of N—H and the peak at 2100 $cm^{-1}$ was the stretching vibration of Ga—H. The intensity ratio of absorption of NH/GaH was 0.23.

Comparative Example

A commercially available electron beam evaporation system was used. Less than 5 g of GaN powder of a purity of 5N was placed in a crucible, and the same substrates as in example 1 were positioned at a distance of 15 cm above the crucible. The evaporation system was carefully evacuated to a pressure of $10^{-4}$ Pa. The substrates were heated by an infrared lamp heater to 200° C. An electron beam current was gradually increased to and then maintained at 100 mA, and evaporation of the substrates was conducted, while the shutter was opened for 5 min. During evaporation, the temperature of the substrates was raised by 50° C. Cooling was carried out immediately after the evaporation was terminated, and after cooling the film was taken out into the air to measure its characteristics. The film was amorphous and its composition almost satisfied a stoichiometric ratio. No hydrogen was included in the film. Conductivity was not changed when light was radiated on the amorphous GaN film as in the example 1.

Example 3

The same apparatus and the same substrates as in example 1 were used in this example. $N_2$ gas was introduced through the gas inlet pipe 20 at a flow rate of 500 sccm, and a discharge was conducted with microwaves at 2.45 GHz, and an output of 200 W. On this occasion, reflected waves were 0 W. $H_2$ gas was introduced through the gas inlet pipe 22 at a flow rate of 200 sccm, and a discharge was conducted with high frequency waves at 13.56 MHz and an output of 100 W. At ths time, reflected waves were 0 W. The temperature of the substrate holder was increased to 250° C. by the heater 18. In this condition, trimethyl gallium gas was introduced through the gas inlet pipe 32 at a feed rate of 2 sccm, and trimethyl indium, which had been stored at 50° C., was introduced, together with $N_2$ gas at a feed rate of 1 sccm. In addition, $SiH_4$ gas diluted with $N_2$ at a content of 1% was introduced through the gas inlet pipe 34, to form a film of an n-type a-Ga$_x$In$_y$N$_z$. Pressure was adjusted to 0.2 Torr. After 10 min of film formation had elapsed, the respective valves for the gas inlet pipes 32, 34 were closed. At this time, the discharge was continued. In this condition, trimethyl gallium at a feed rate of 2 sccm, and trimethyl indium at a feed rate of 1 sccm, were in mixture introduced through the gas inlet pipe 32, and bis-pentadienyl magnisium was introduced at a feed rate of 10 sccm through the gas inlet pipe 34, using N$_2$ as a carrier gas, to produce a p-type a-Ga$_x$In$_y$N$_z$ in the form of a film for 5 min.

The thickness obtained was 1 μm. The composition of the film was measured by RBS and the resulting ratio of Ga/In/N was found to be 0.7/0.3/1. The content of oxygen was 5 atomic % and the content of carbon was 7 atomic %. The hydrogen content was 18 atomic % as meassured by HFS. The optical gap of the entire film was 2.9 eV. An Au electrode 100 Å in thickness, which is optically permeable, was vapor-deposited on the Al substrate. Au electrodes were vapor-deposited on both surfaces of the Si wafer and a photoelectromotive force of 9 V in open voltage was obtained, on exposure to Xe lamp light.

Example 4

Figure 3:
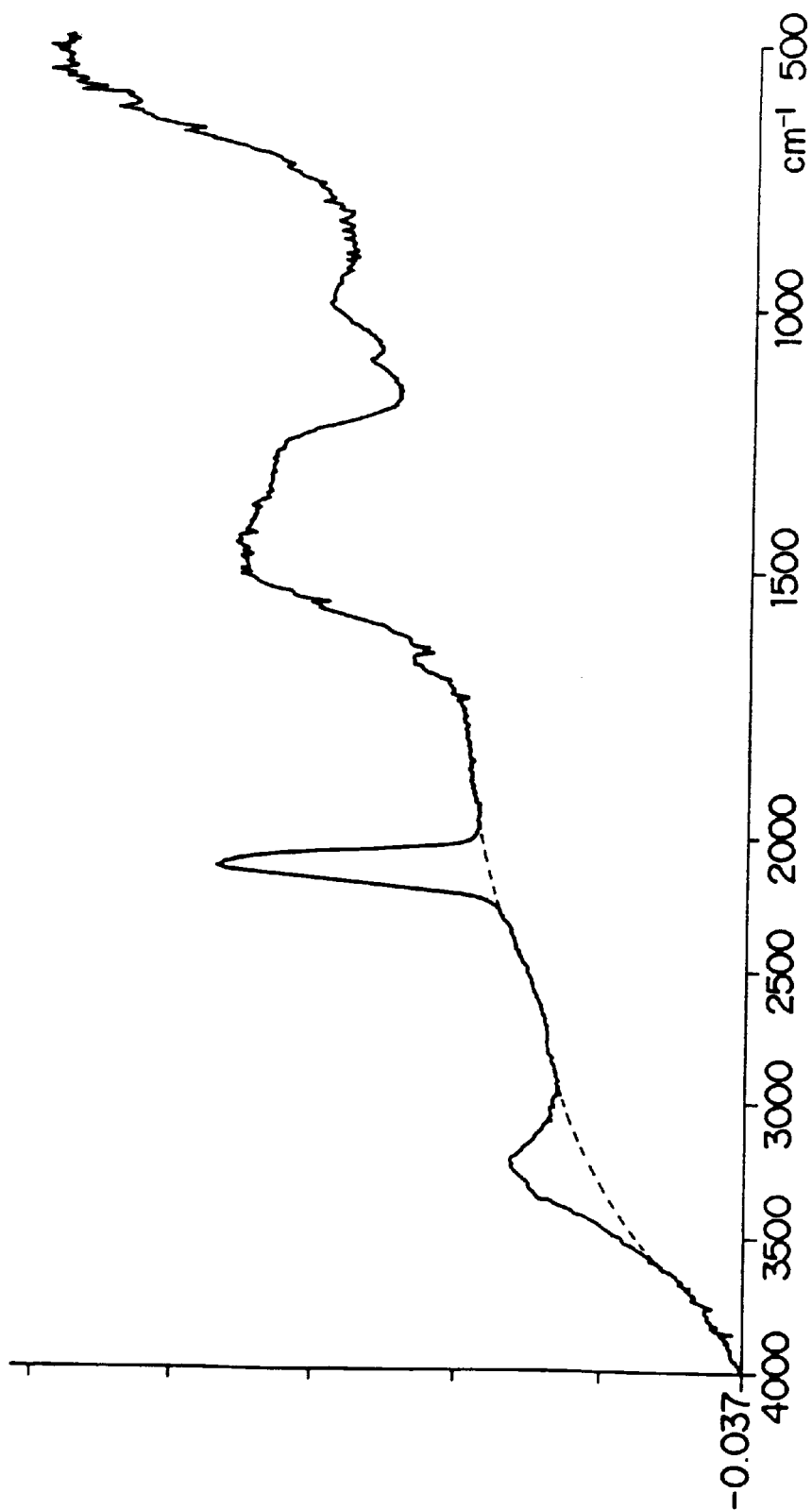
FIG. 3 is a graph showing the infrared absorption spectrum of the film composition obtained in Example 4.

The same apparatus and the same substrates as in example 2 were used in this example. N$_2$ gas was introduced through the gas inlet pipe 20 at a flow rate of 500 sccm, and a discharge was conducted with microwaves at 2.45 GHz and an output of 250 W. At this time reflected waves were 0 W. H$_2$ gas was introduced through the gas inlet pipe 22 at a flow rate of 100 sccm, and a discharge was conducted with high frequency waves at 13.56 MHz and an output of 100 W. In this case reflected waves were 0 W. The substrate holder was heated and controlled at 100° C. by the heater 18. In this condition, trimethyl gallium was introduced through the gas inlet pipe 32 at a feed rate of 1 sccm. A film composition was obtained at a Ga/N ratio of 1.05, which was found to be almost equal to a stoichiometric ratio. At this point of time the contents of carbon (C) and oxygen (O) both were 0 atomic %. The content of hydrogen was 35 atomic % according to HFS measurement. However, the surface of the film was oxidized and the amount of oxygen was over 20 atomic %, although the content of hydrogen had decreased. The optical gap was 3.5 eV. No clear peaks were observed in electron diffraction spectra and X-ray diffraction spectra, which showed that the film was amorphous. An infrared absorption spectrum of the film composition, which was obtained, is shown in FIG. 3. In FIG. 3, the intensity ratio in absorption of NH to GaH was 0.4 and no absorption of CH was observed. When Xe lamp light was radiated on the amorphous GaN film, the ratio between resistivities, in light and dark conditions was measured at more than three digits.

Example 5

Figure 4:
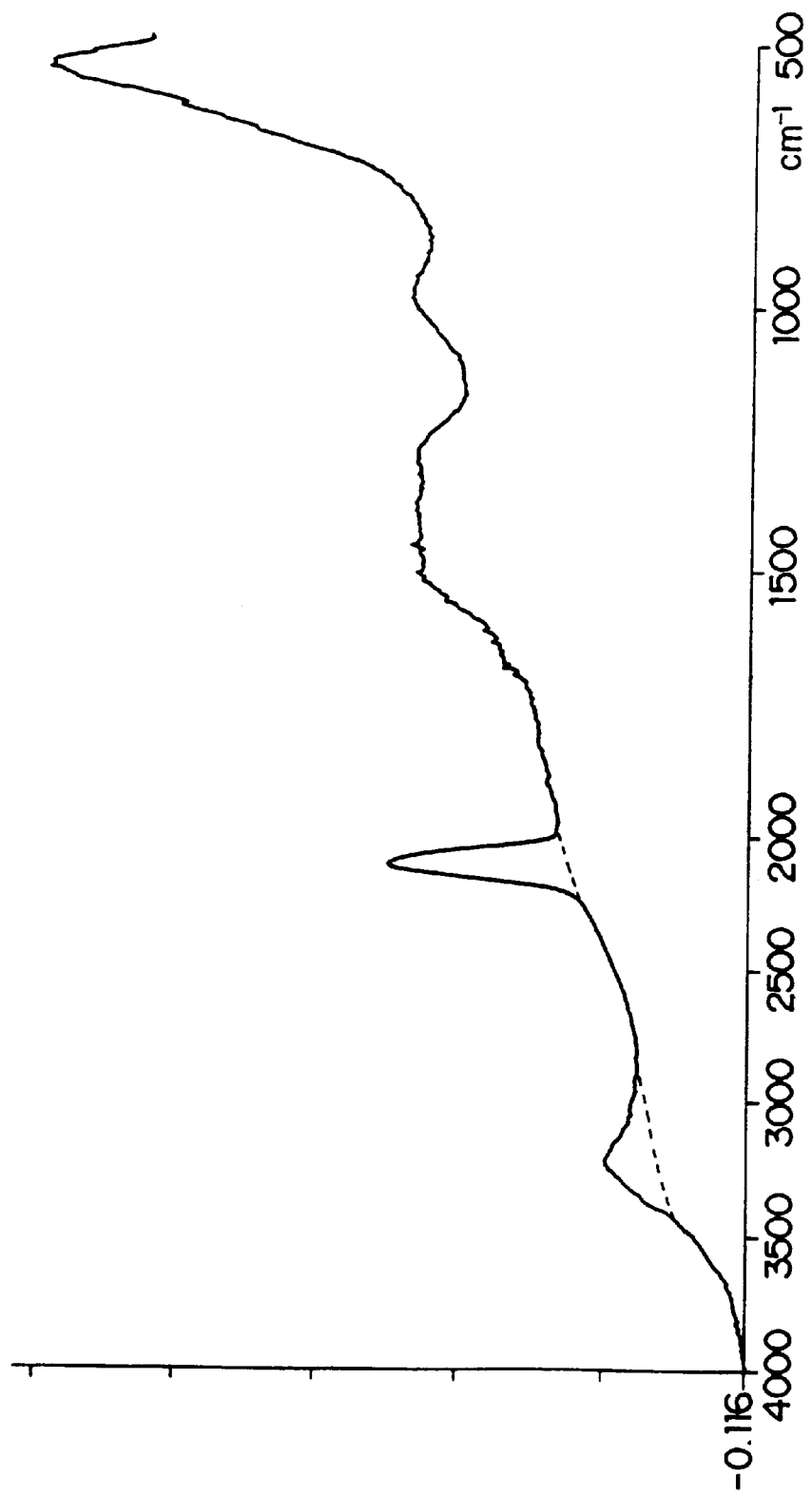
FIG. 4 is a graph showing the infrared absorption spectrum of the film composition obtained in Example 5.

A film was produced in the same conditions as in example 4 except that the temperature was set at 200° C. The composition of the film was aGa/N ratio of 0.95, which was found to be almost equal to a stoichiometric ratio. At a this time, no carbon (C) was detected, but the content of oxygen (O) was 10 atomic %. The reason for the oxygen content was unclear. The content of hydrogen was 27 atomic % as measured by RBS. No oxidation of the surface of the film was observed. No clear bright spot was observed in electron diffraction and X-ray diffraction spectra, which showed that the film was amorphous. An infrared absorption spectrum of the film composition, which was obtained, is shown in FIG. 4. In FIG. 4, the intensity ratio in the absorption spectrum between NH and GaH was 0.25 and no absorption of CH was observed. The ratio between resistivities in light and dark conditions of the amorphous GaN film was measured under exposure to Xe lamp light and the result showed a photoconductvity of more than four digits in terms of the ratio between resistivities.

Example 6

A film was produced in the same conditions as in example 4 except that the temperature of the substrates was set at 300° C.

Figure 5:
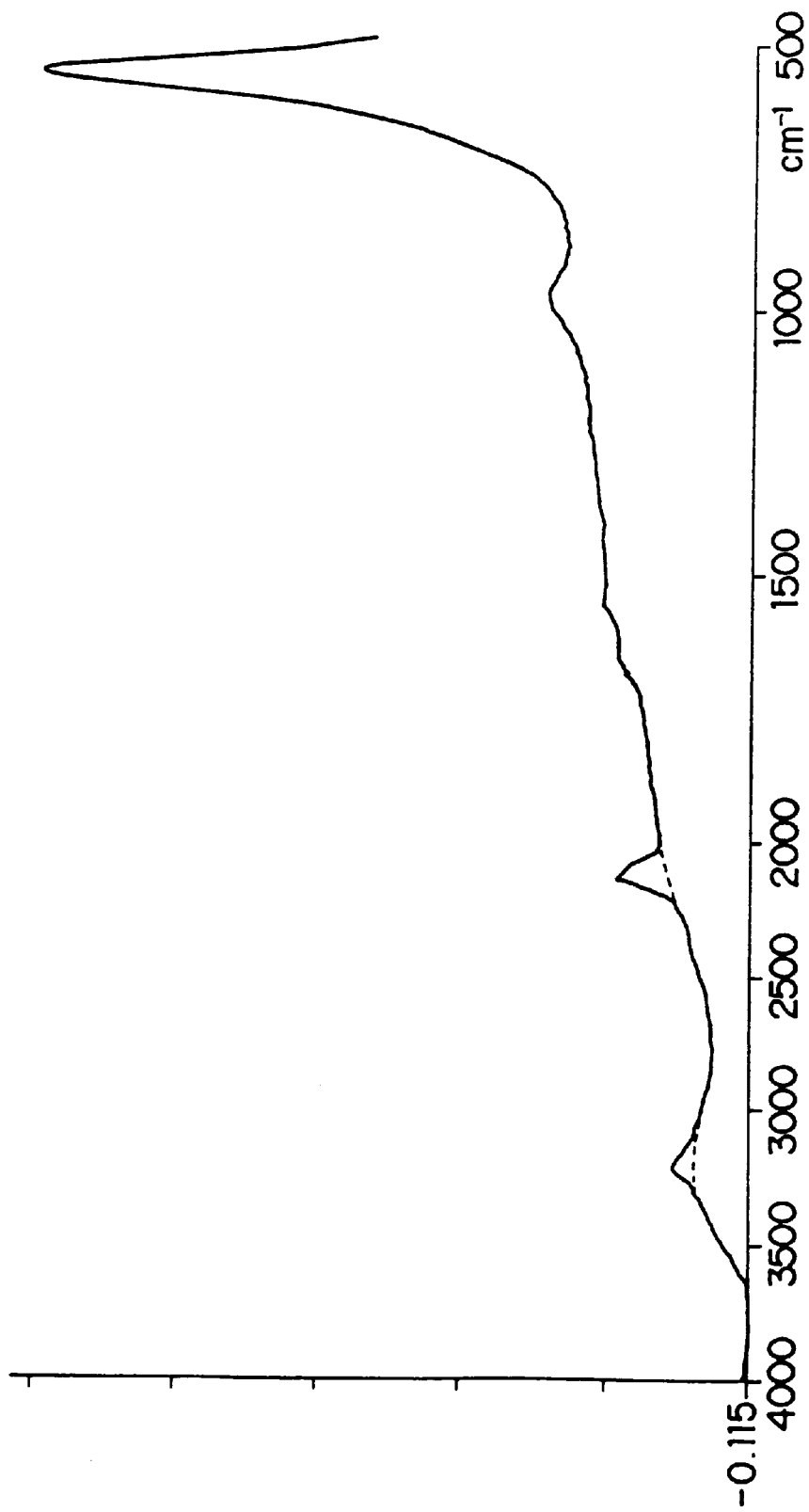
FIG. 5 is a graph showing the infrared absorption spectrum of the film composition obtained in Example 6.

It was found that the film composition was a Ga/N ratio of 0.98, which was almost equal to a stoichiometric ratio. At this time neither carbon (C) nor oxygen (O) was detected. The content of hydrogen by RBS measurement was 18 atomic %. No oxidation was observed on the surface of the film. A bright spot was observed in a vague pattern of the electron diffraction spectrum, from which it was found that the film was an amorphous material containing a microcrystal of 50 Å or less in diameter. An infrared absorption spectrum of the film composition, which was obtained, is shown in FIG. 5. In FIG. 5, the intensity ratio of absorption between NH and GaH was 0.46 and no absorption of CH was observed. The absorption peak of GaN in the vicinity of 570 cm$^{-1}$ was narrowed as the intensity was increased, from which it was found that the film contained a microcrystalline state. The ratio between resistivities in light and dark conditions was measured at more than four digits, when Xe lamp light was radiated on the amorphous GaN film. The dark resistance was lower than that in example 5.

Example 7

The same apparatus and the same substrates were used as in example 2 and N$_2$ gas was introduced through the gas inlet pipe 20 at flow rate of 900 sccm, and a discharge was conducted with microwaves at 2.45 GHz at an output of 250 W. At this time, reflected waves were 0 W. H$_2$ gas was introduced through the gas inlet pipe 22 at a flow rate of 300 sccm, and no discharge was conducted. The substrate holder was heated to and maintained at 250° C. by the heater 4. In this condition, trimethyl gallium was introduced through the gas inlet pipe 12 at a feed rate of 3 sccm. The film composition was a Ga/N ratio of 0.97 and the composition was found to be almost equal to a stoichiometric ratio. At this point, the carbon (C) content was 12 atomic % and the oxygen (O) content was 0 atomic %. The hydrogen content as measured by PBS was 22 atomic %. The optical gap was 3.4 eV. No clear peaks were observed in electron diffraction and X-ray diffraction spectra and the film was found to be amorphous.

Figure 6:
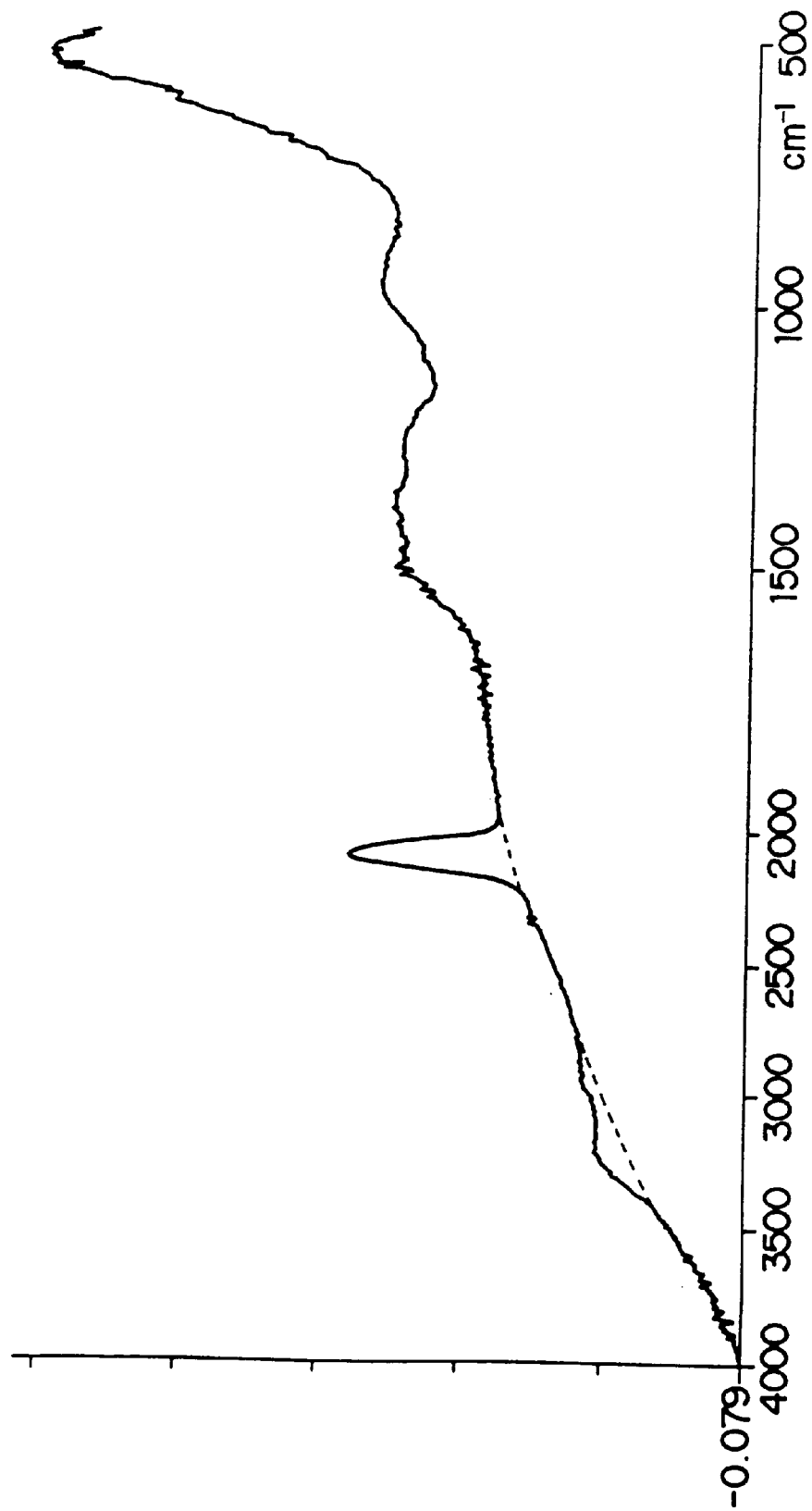
FIG. 6 is a graph showing the infrared absorption spectrum of the film composition obtained in Example 7.

An infrared absorption spectrum of the composition of the film, which was obtained, is shown in FIG. 6. In FIG. 6, the intensity ratio of absorption between NH and GaH was 0.2. The ratio between resistivities in light and dark conditions was measured at more than four digits, when Xe lamp light was radiated on the amorphous GaN film.

Example 8

An Al substrate, a quartz substrate and an Si wafer which had been cleaned, were placed on the substrate holder 16, and the vessel 14 was evacuated through the exhaust port 12, and thereafter the substrates were heated to 350° C. by the heater 18.

N$_2$ gas was introduced through the gas inlet pipe 20 into the quartz pipe 28, being 25 mm in diameter, at a flow rate of 1000 sccm and microwaves were discharged at a frequency of 2.45 GHz at an output of 300 W, through the microwave guide pipe 24, while matching was made with a tuner. At this time, reflected waves were 0 W. $H_2$ gas was introduced through the gas inlet pipe 22 into the quartz pipe 30, being 30 mm in diameter, at a flow rate of 100 sccm. An output of microwaves was set at 300 W. Reflected waves were 0 W. In this condition, a vapor of trimethyl gallium (TMGa), which was kept at room temperature, was incorporated through the gas inlet pipe 12, while the feed rate was set at 1 sccm directly under the control of a mass flow controller. At this time, the reaction pressure was 0.2 Torr as measured by a varatron vacuum gauge.

The thickness of the film was measured at 0.5 $\mu$m by step measurement. The film composition was measured at a Ga/N ratio of 1.1 as measured by XPS and RBS (Rutherford backscattering) and the composition was found to be almost equal to a stoichiometric ratio. At this time, the content of carbon (C) was 5 atomic % or less and no oxygen (O) was detected.

The optical gap was 3.2 eV. The content of Hydrogen was measured at 10 atomic % as measured by HFS. Hydrogen was included in the GaN film in the forms of Ga—H and N—H according to IR measurement. A clear bright spot was observed in the electron diffraction spectra and it was found that crystal was formed in the film. A section was measured by a transmission electron microscope and the size of the microcrystals was approximately 1 $\mu$m.

Resistivity was measured on the microcrystaline GaN film to obtain $1.5 \times 10^8$ $\Omega$cm and when the film was exposed to Xe lamp light it was measured at $3.5 \times 10^4$ $\Omega$cm. The ratio between resistivities in light and dark conditions was found to be shown at more than four digits.

Example 9

This example was conducted in the same way as in example 8 except that the discharge was conducted in $H_2$ gas with high frequency waves at 13.56 MHz at an output of 100 W by way of the high frequency coil 26.

The composition of the film, which was obtained, was measured at a Ga/N ratio of 0.99 and the film composition was found to be almost equal to a stoichiometric ratio, with a hydrogen content of 13 atomic %. The optical gap was 3.2 eV. A clear bright spot was observed in the electron diffraction spectrum and crystallites were found to be formed in the film. A section was measured with a transmission electron microscope and the size of the crystallites was in the range of 0.3 to 0.7 $\mu$m. Resistivity in dark conditions was $1 \times 10^9$ $\Omega$cm and the ratio between resistivities in light and dark conditions was measured at more than four digits.

Example 10

The same apparatus and the same substrates were used as in example 8. $N_2$ gas was introduced through the gas inlet pipe 20 at a flow rate of 1000 sccm and microwaves were discharged at a frequency of 2.45 GHz at an output of 300 W.

At this time, reflected waves were 0 W. $H_2$ gas was introduced through the gas inlet pipe 22 at a flow rate of 300 sccm and a discharge was conducted at high frequency of 13.56 MHz at an output of 100 W. At this time, reflected waves were 0 W. The substrate holder 16 was heated to 300° C. by the heater 18.

In this condition, trimethyl gallium was introduced through the gas inlet pipe 32 at a feed rate of 0.5 sccm and trimethyl indium heated and held at 50° C. was introduced at a feed rate of 0.5 sccm together with $N_2$ gas in mixture. Moreover, $SiH_4$ diluted with $N_2$ gas at 0.1% was introduced through the gas inlet pipe 34 and a film of n-type a-$Ga_xIn_yN_z$ was formed. The pressure was set at 0.2 Torr. After 30 minutes of film formation had elapsed, valves of the gas inlet pipes 32, 34 were closed. At this time, the discharge continued to be conducted. In this condition, trimethyl gallium and trimethyl indium were again respectively introduced at a feed rate of 0.5 sccm in mixture through the gas inlet pipe 34 and bis-pentadienyl magnesium was introduced through the gas inlet pipe 32 at a feed rate of 1 sccm in mixture with $N_2$ gas as a carrier gas and a p-type a-$Ga_xIn_yN_z$ film was formed for 30 min.

The thickness of the film, which was obtained, was 0.3 $\mu$m. The film composition was 0.65/0.35/1.1 of $Ga_x/In_y/N_z$ and the content of hydrogen was 15 atomic %. The total optical gap of the film was 2.8 eV.

A clear bright spot was observed in the electron diffraction spectra and crystallites were found to be formed in the film. A section was measured with a transmission electron microscope and the size of the crystallites was in the range of 0.1 to 0.5 $\mu$m. An Au electrode of 100 A in thickness, which was optically transmissive, was vapor deposited on the Al substrate, and Au electrodes were vapor deposited on both surfaces of the Si wafer and were irradiated with Xe lamp light. The photoelectromotive force was measured at 0.8 V in open voltage.

Example 11

The same apparatus and the same substrates as in example 9 were used. $N_2$ gas introduced through the gas inlet pipe 20 at a flow rate of 1000 sccm, and microwaves were discharged at a frequency of 2.45 GHz at an output of 300 W.

At this time, reflected waves were 0 W. $H_2$ gas was introduced through the gas inlet pipe 22, at a flow rate of 100 sccm, and a discharge was conducted with high frequency waves of 13.56 MHz at an output of 300 W. At this time, reflected waves were 0 W. The substrate holder was heated to 400° C. by the heater 18.

In this condition, trimethyl gallium was introduced through the gas inlet pipe 32, at a feed rate of 1 sccm. The composition of the film was measured at a Ga/N ratio of 1.05, and the composition was found to be almost equal to a sstoichiometric ratio. The content of hydrogen was 5 atomic % as measured by HFS. The optical gap was 3.1 eV. A clear bright spot and peaks were observed in electron diffraction and X-ray diffraction spectra, and the film was shown to contain microcrystals.

The size of the crystallite was measured, using a crystallite cross-section by a transmission electron microscope, as being in the range of 1.0 to 5.0 $\mu$m. Resistivity of the microcrystalline GaN film was measured at $2.5 \times 10^7$ $\Omega$cm, and when Xe lamp light was radiated on the film, resistivity was measured at $5 \times 10^3$ $\Omega$cm. From the results, it was found that the film showed a photoconductivity with a ratio between resistivities in light and dark conditions of more than four digits.

Example 12

This example was conducted in the same way as in example 11 except that the temperature of the substrates was set at 250° C.

The composition of the film was a Ga/N ratio of 0.98 and it was found that the composition was found to be almost equal to a stoichiometric ratio. The content of hydrogen was measured at 28 atomic % as measured by HFS. The optical gap was 3.2 eV. A clear bright spot was observed in a vague pattern of the electron diffraction spectra and it was found that the film was a microcrystalline film. A section was measured by a transmission electron microscope and the size of the crystals was in the range of 10 to 50 nm. Resistivity of the microcrystalline GaN film was measured at $4.0 \times 10^{12}$ Ωcm and when the film was irradiated with Xe lamp light, resistivity was measured at $3 \times 10^7$ Ωcm. From the results, it was found that the film showed a photoconductivity of more than four digits in the ratio between resistivities in light and dark conditions.

Example 13

The same apparatus and the same substrate were used as in example 9. $N_2$ gas was introduced through the gas inlet pipe 20, at a flow rate of 900 sccm, and microwaves were discharged at a frequency of 2.45 GHz, at an output of 250 W. At this time, reflected waves were 0 W. $H_2$ gas was introduced through the gas inlet pipe 22, at a flow rate of 300 sccm, and no discharge was conducted. The substrate holder 16 was heated to 250° C. by the heater 18.

In this condition, trimethyl gallium was introduced through the gas inlet pipe 32 at a feed rate of 3 sccm. The composition of the film, which was obtained, was a Ga/N ratio of 0.97 and the composition was found to be almost equal to a stoichiometric ratio. At this time, the content of carbon (C) was 12 atomic %. The content of oxygen (O) was 0 atomic %. The content of hydrogen was measured at 25 atomic %, when the content was measured by IR absorption spectra based on the data from examples 1 to 5 which were measured by HFS measurement. The optical gap was 3.4 eV. A clear bright spot was observed in a vague pattern of the electron diffraction and X-ray diffraction spectra and it was found that the film was a microcrystalline film. A section was measured by a transmission electron microscope and crystallites of a size in the range of 5 to 20 nm were confirmed in the film. The ratio between resistivities in light and dark conditions was measured on the microcrystalline GaN film after exposure of the film to Xe lamp light and it was found that the ratio was shown at more than four digits.

Comparative Example 2

The same apparatus and the same substrates as in example 1 were used. $N_2$ gas was introduced through the gas inlet pipe 20, at a flow rate of 1000 sccm, and microwaves were discharged at a frequency of 2.45 GHz at an output of 300 W. At this time, reflected waves were 0 W. $H_2$ was introduced at a flow rate of 50 sccm. The substrate holder 16 was heated to 450° C. by the heater 18.

In this condition, trimethyl gallium was introduced through the gas inlet pipe 20 at a feed rate of 0.5 sccm. The composition of the film, which was obtained, was measured at a Ga/N ratio of 1.03 and it was found that the composition was almost equal to a stoichiometric ratio.

The content of hydrogen was measured at 0.4 atomic % using calibration curves for HFS and IR absorption measurements. The optical gap was 3.2 eV. A clear bright spot and peaks were observed in the electron diffraction and the X-ray diffraction spectra, and the film was found to be a microcrystalline film.

Resistivity of the microcrystalline GaN film was measured to be $2.5 \times 10^6$ Ωcm, and when the film was irradiated with Xe lamp light, resistivity was measured to be $5 \times 10^4$ Ωcm. While, from the results, it was found that the film showed a photoconductivity of a ratio between resistivities in light and dark conditions of more than two digits, the time interval, in which measurement of a resistivity reaches an equilibrium after irradiation of Xe lamp light was started, was several hours, and a rapid decrease in current was not observed after the irradiation was turned off. That is to say, there was almost no change in conductivity according to whether light irradiation was switched on or off over a short time period.

What is claimed is:

1. An amorphous optical semiconductor comprising:

hydrogen;

wherein a ratio of a total number of group III element atoms to a number of nitrogen atoms is in the range of 1:0.5 to 1:2.

2. An amorphous optical semiconductor according to claim 1, wherein said hydrogen is in the range of not less than 1 atomic % to not more than 50 atomic %.

3. An amorphous optical semiconductor according to claim 1, wherein the amorphous optical semiconductor is formed by using an organometallic compound including at least a group III element, and the formed amorphous optical semiconductor includes hydrogen, a second compound comprising a group III element, and a nitrogen element.

4. An amorphous optical semiconductor according to claim 1, wherein the group III element is at least one element selected from the group consisting of Al, Ga and In.

5. An amorphous optical semiconductor according to claim 1, wherein the amorphous optical semiconductor further comprises at least one selected from the group consisting of C, Si, Ge and Sn.

6. An amorphous optical semiconductor according to claim 1, wherein the amorphous optical semiconductor further comprises at least one selected from the group consisting of Be, Mg, Ca, Zn and Sr.

7. An optical semiconductor element comprising an amorphous optical semiconductor according to claim 1.

8. An amorphous optical semiconductor according to claim 1, wherein the amorphous optical semiconductor further comprises a microcrystalline structure.

9. An amorphous optical semiconductor comprising: hydrogen in the range of not less than 1 atomic % to not more than 50 atomic %; at least one element selected from the group consisting of Al, Ga and In; oxygen and carbon each of not more than 15 atomic %; and nitrogen.

10. A microcrystalline compound optical semiconductor comprising a crystal including: Ga;

nitrogen; and hydrogen in the range of not less than 0.5 atomic % to not more than 40 atomic %.

11. A microcrystalline compound optical semiconductor according to claim 10, wherein said microcrystalline compound further comprises Al and/or In.

12. A microcrystalline compound optical semiconductor according to claim 10, wherein said microcrystalline compound is produced using an organometallic compound including at least Ga as a raw material.

13. A microcrystalline compound optical semiconductor according to claim 10, wherein said microcrystalline compound is produced using an organometallic compound including Ga and Al and/or In as a raw material.

14. An optical semiconductor element having at least one of the microcrystalline compound semiconductors from among the microcrystalline compound optical semiconductors according to claim 13.

15. A microcrystalline compound optical semiconductor according to claim 10, wherein said microcrystalline compound further comprises at least one element selected from the group consisting of C, Si, Ge and Sn.

16. An optical semiconductor element having at least one of the microcrystalline compound semiconductors from among the microcrystalline compound optical semiconductors according to claim 15.

17. A microcrystalline compound optical semiconductor according to claim 10, wherein said microcrystalline compound further comprises at least one element selected from the group consisting of Be, Mg, Ca, Zn and Sr.

18. An optical semiconductor element, using a microcrystalline compound optical semiconductor according to claim 10 as an photoconductive substance.

19. A microcrystalline compound optical semiconductor according to claim 10, wherein said structure of the microcrystalline compound optical semiconductor further comprises an amorphous structure.

* * * * *